US010128858B2

(12) United States Patent
Goldberg et al.

(10) Patent No.: US 10,128,858 B2
(45) Date of Patent: Nov. 13, 2018

(54) PHASE-LOCKED LOOP CIRCUITRY INCLUDING IMPROVED PHASE ALIGNMENT MECHANISM

(71) Applicant: Intel Corporation, Santa Clara, CA (US)

(72) Inventors: Yaakov Goldberg, Jerusalem (IL); Udi Virobnik, Givaataim (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/478,484

(22) Filed: Apr. 4, 2017

(65) Prior Publication Data

US 2018/0287622 A1 Oct. 4, 2018

(51) Int. Cl.
| H03L 7/06 | (2006.01) |
| H03L 7/099 | (2006.01) |
| H03L 7/091 | (2006.01) |
| H04L 7/033 | (2006.01) |
| H03K 19/21 | (2006.01) |

(52) U.S. Cl.
CPC ............ *H03L 7/0992* (2013.01); *H03L 7/091* (2013.01); *H04L 7/0331* (2013.01); *H03K 19/21* (2013.01)

(58) Field of Classification Search
CPC ..... H03L 7/0992; H03L 7/091; H03L 7/0331; H03K 19/21
USPC .......................................................... 327/159
See application file for complete search history.

(56) References Cited

U.S. PATENT DOCUMENTS

| 5,170,135 | A | * | 12/1992 | Ito ........................... H03L 7/081 331/1 A |
| 5,347,232 | A | * | 9/1994 | Nishimichi ............. H03L 7/087 331/1 A |
| 5,886,582 | A | * | 3/1999 | Stansell .................... G06F 1/10 327/143 |
| 7,015,727 | B2 | * | 3/2006 | Balasubramanian ....................... H03D 13/004 327/43 |
| 8,085,067 | B1 | * | 12/2011 | Stiff .................... H03F 3/45179 327/51 |
| 9,577,815 | B1 | * | 2/2017 | Simpson ............... H04L 7/0012 |
| 2004/0095189 | A1 | | 5/2004 | Rochow |
| 2005/0184772 | A1 | | 8/2005 | Wilson et al. |

(Continued)

FOREIGN PATENT DOCUMENTS

JP 2012049659 A 3/2012

OTHER PUBLICATIONS

"International Application Serial No. PCT/US2018/025893, International Search Report dated Jul. 26, 2018", 3 pgs.

(Continued)

*Primary Examiner* — Ryan Jager
(74) *Attorney, Agent, or Firm* — Schwegman Lundberg & Woessner, P.A.

(57) ABSTRACT

Some embodiments include apparatuses and methods of operating such apparatuses. One of the apparatuses includes a first circuit included in a phase-locked loop (PLL) to receive an input clock signal and a feedback clock signal, and to generate an output clock signal; a second circuit included in the PLL to generate the feedback clock signal from the output clock signal; and a third circuit to prevent the output clock signal from toggling during a portion of a time interval when the PLL performs an operation of aligning phases of the input clock signal and feedback clock signal.

21 Claims, 4 Drawing Sheets

(56) References Cited

U.S. PATENT DOCUMENTS

| | | |
|---|---|---|
| 2008/0048791 A1 | 2/2008 | Fahim |
| 2013/0099839 A1 | 4/2013 | Kao et al. |
| 2013/0147529 A1* | 6/2013 | Ganesan ............... H03L 7/1803 327/156 |

OTHER PUBLICATIONS

"International Application Serial No. PCT/US2018/025893, Written Opinion dated Jul. 26, 2018", 8 pgs.

* cited by examiner

PHASE-LOCKED LOOP CIRCUITRY INCLUDING IMPROVED PHASE ALIGNMENT MECHANISM

TECHNICAL FIELD

Embodiments described herein pertain to clock signal generation in integrated circuits. Some embodiments relate to phase-locked loop (PLL) circuitry.

BACKGROUND

Many electronic devices and systems (e.g., computers, tablets, digital televisions, and cellular phones) control their internal operations based on timing of a clock signal or multiple clock signals. Such devices and systems usually have a PLL to generate the clock signal based on a reference clock signal. For timing accuracy, the PLL performs a phase alignment operation in order to align the phase (e.g., an edge) of the generated clock signal with the phase (e.g., an edge) of the reference clock signal. The phase alignment operation is part of an overall locking operation of the PLL. The PLL can be in a locked state after the generated clock signal is aligned with the reference clock signal. In some conventional PLLs, such as some digital PLLs and low band-width PLLs, the phase alignment operation can be a lengthy process and can become a bottleneck for the overall locking operation of such conventional PLLs.

DETAILED DESCRIPTION

The techniques described herein include an improved PLL. Detailed circuit elements, operations, and improvements associated the techniques described herein are presented below with reference to FIG. 1 through FIG. 4.

Figure 1:
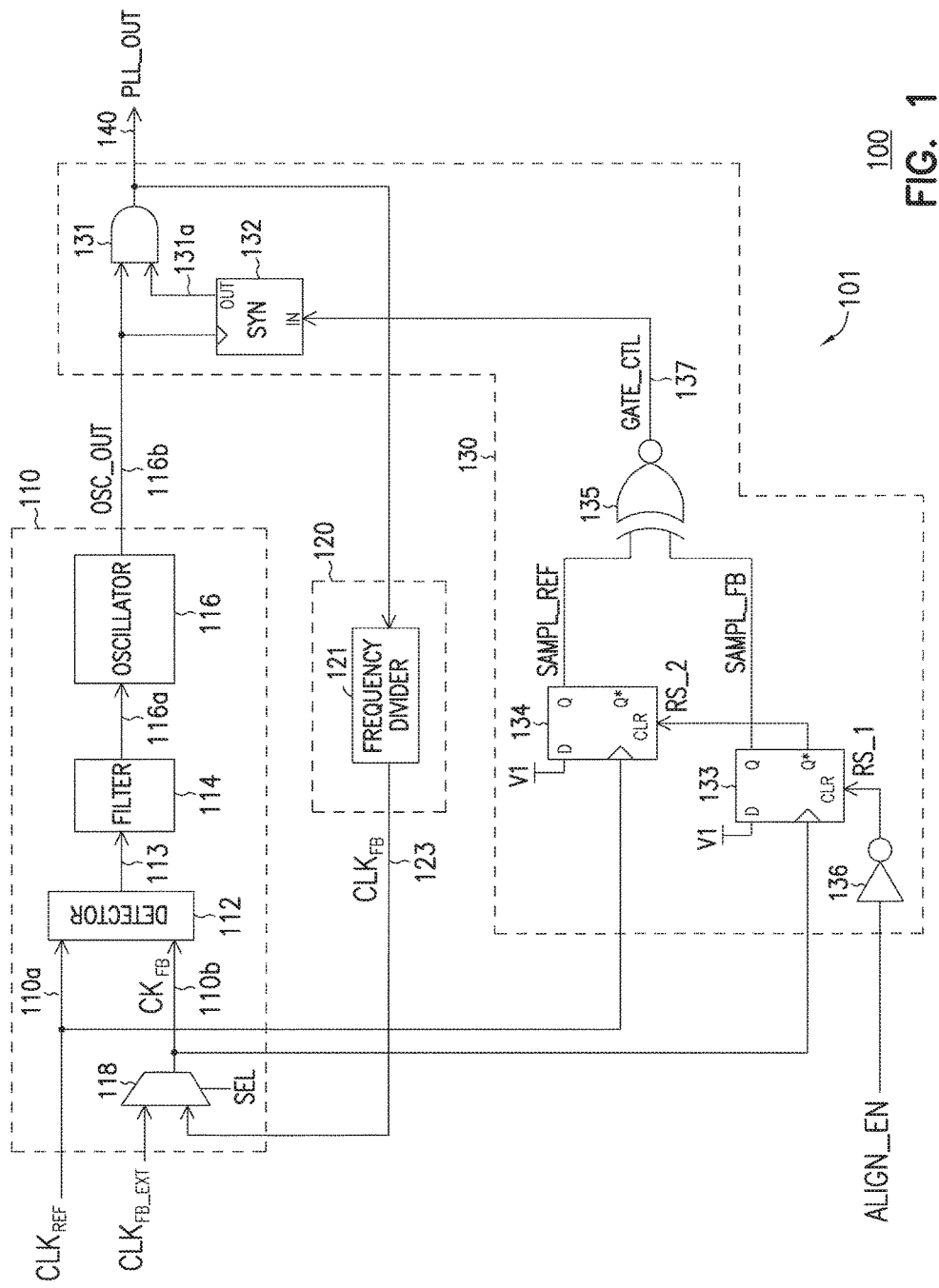
FIG. 1 shows a block diagram of an apparatus including a PLL, according to some embodiments described herein.

FIG. 1 shows a block diagram of an apparatus 100 including a PLL 101, which includes circuits 110, 120, and 130, according to some embodiments described herein. Apparatus 100 can include or be included in an electronic device or system, such as a computer (e.g., server, desktop, laptop, or notebook), a tablet, a cellular phone, an integrated circuit (IC) chip, or other electronic devices and systems. Circuits 110, 120, and 130 of PLL 101 can be part of the same device. For example, apparatus 100 can include a device that has a single IC chip where circuits 110, 120, and 130 of PLL 101 can be located on (e.g., formed in or formed on) a semiconductor (e.g., silicon) substrate of the IC chip. In this example, circuits 110, 120, and 130 of PLL 101 can communicate with each other through conductive paths formed inside the IC chip. The IC chip can include a processor (e.g., a general-purpose processor, an application specific integrated circuit (ASIC), or other types of processors), a memory device, or other types of IC devices.

PLL 101 can be an analog PLL or a digital PLL (e.g., all-digital PLL). PLL 101 can be an inductor-capacitor (LC) based PLL, a ring oscillator (RO) based PLL, or other types of PLL architectures.

As shown in FIG. 1, PLL 101 can receive an input clock signal (e.g., a reference clock signal) $CLK_{REF}$ and generate an output clock signal PLL_OUT. The frequency of output clock signal PLL_OUT can be higher than (or the same as) the frequency of input clock signal $CLK_{REF}$. Output clock signal PLL_OUT may be used as a timing signal (e.g., a clock signal) in other components (not shown) of an IC chip that includes PLL 101.

Circuit 110 of PLL 101 can include a detector 112, a filter 114, an oscillator 116, and a selector (e.g., multiplexor) 118. Circuit 110 can include nodes (e.g., input nodes) 110a and 110b to receive input clock signal $CLK_{RFF}$ and a feedback clock signal $CK_{FB}$, respectively. Detector 112 can include input nodes coupled to nodes 110a and 110b to receive input clock signal $CLK_{RFF}$ and feedback clock signal $CK_{FB}$. Detector 112 can include a phase detector, time-to-digital convert (TDC) phase detector, or phase-frequency detector.

Filter 114 can include an input node coupled to an output node 113 of detector 112, and an output node coupled to an input node 116a of oscillator 116. Filter 114 can include an analog filter or a digital filter.

Oscillator 116 can generate a signal OSC_OUT (e.g., an oscillating signal) and provide it to an output node 116b of oscillator 116. The frequency of signal OSC_OUT can be higher than (or the same as) the frequency of input clock signal $CLK_{REF}$. Oscillator 116 can include a voltage-controlled oscillator (VCO) or a digitally-controlled oscillator (DCO).

Circuit 120 can be part of a feedback loop of PLL 101. Circuit 120 can include a frequency divider 121, which can include an input node 121a coupled to a node 140 (e.g., an output node of PLL 101) to receive output clock signal PLL_OUT. Frequency divider 121 can generate feedback clock signal $CLK_{FB}$ from output clock signal PLL_OUT. Frequency divider 121 can provide feedback clock signal $CLK_{FB}$ to its output node 123. The frequency of feedback clock signal $CLK_{FB}$ can be lower than the frequency of output clock signal PLL_OUT. The frequency of feedback clock signal $CLK_{FB}$ can be the same as the frequency of input clock signal $CLK_{REF}$.

Selector 118 can include input nodes to receive feedback clock signal $CLK_{FB}$ and a feedback clock signal $CLK_{FB\_EXT}$, and a node to receive a select signal SEL. Selector 118 can select either feedback clock signal $CLK_{FB}$ or feedback clock signal $CLK_{FB\_EXT}$ and provide the selected clock signal (either $CLK_{FB}$ or $CLK_{FB\_EXT}$) to an output node (coupled to node 110b) of selector 118 as feedback clock signal $CK_{FB}$. Feedback clock signal $CLK_{FB\_EXT}$ can be a feedback clock signal generated by a circuit (not shown) coupled to node 140. Such a circuit can be similar to or the same as circuit 120. The inclusion of selector 118 allows flexibility in structuring circuit elements associated with PLL 101. For example, PLL 101 can include a long loop or a short loop (e.g., a feedback loop including frequency divider 121 as shown in FIG. 1). The location of circuit elements (e.g., a frequency divider) of such a long loop can be at a longer distance from detector 112 relative to the distance of circuit 130 to detector 112 of FIG. 1. Selector 118 allows a feedback clock signal (e.g., $CLK_{FB\_EXT}$) from that long loop to be provided to detector 112 without directly accessing circuit elements of that long loop.

As shown in FIG. 1, circuit 130 of PLL 101 can include logic circuitry, which includes a logic gate (e.g., AND gate)

131 and a synchronizer (SYN) 132. Logic gate 131 and synchronizer 132 can operate to receive signal OSC_OUT from oscillator 116 and to generate output clock signal PLL_OUT based on signal OSC_OUT. Circuit 130 can also include a flip-flop 133, a flip-flop 134, and an inverter 136.

FIG. 1 shows circuit 130 being separate from circuits 110 and 120 of PLL 101 as an example. Further, in FIG. 1, logic gate 131, synchronizer 132, flip-flop 133, flip-flop 134, logic gate 135, and inverter 136 are grouped into circuit 130 as an example. However, a portion of circuit 130 or the entire circuit 130 can be a circuit separate from circuit 130, or can be part of other circuits (e.g., circuit 110, 120, or both) of PLL 101. Thus, in FIG. 1, one or more of logic gate 131, synchronizer 132, flip-flop 133, flip-flop 134, logic gate 135, and inverter 136 of circuit 130 can be a circuit separate from circuit 130, or can be part of circuit 110 or circuit 120. As an example, each of logic gate 131 and synchronizer 132 can be a circuit separate from circuit 130, or both of logic gate 131 and synchronizer 132 can be a circuit separate from circuit 130.

As shown in FIG. 1, a logic gate 131 can include an input node coupled to output node 116b of oscillator 116, and an output node coupled to node 140 to provide signal PLL_OUT. The frequency of output clock signal PLL_OUT can be equal to the frequency of signal OSC_OUT.

Synchronizer 132 can include a clock input node coupled to output node 116b to receive signal OSC_OUT. Synchronizer 132 can include an output node (labeled "OUT") coupled to an input node (e.g., node 131a) of logic gate 131. Synchronizer 132 can include an input node (labeled "IN") couple to node 137 to receive a control signal GATE_CTL from node 137.

Synchronizer 132 can operate to synchronize clock signals at input nodes of logic gate 131, such that when control signal GATE_CTL has a signal level corresponding to logic one (binary 1), the signal at output node OUT of synchronizer 132 can follow (e.g., can be synchronized with) the signal OSC_OUT. Thus, when control signal GATE_CTL has a signal level corresponding to logic one, both input nodes of logic gate 131 can have synchronized signals (e.g., copies of signals OSC_OUT). Therefore, when control signal GATE_CTL has a signal level corresponding to logic one, output clock signal PLL_OUT can toggle (e.g., toggle at the same frequency) with signal OSC_OUT.

Synchronizer 132 can operate such that, when control signal GATE_CTL has a signal level corresponding to logic zero (binary 0), the signal at output node OUT of synchronizer 132 also has a signal level corresponding to logic zero. The signal at output node OUT of synchronizer 132 can remain at the logic zero level as long as control signal GATE_CTL remains at the logic zero level. Thus, when control signal GATE_CTL has a signal level corresponding to logic zero, PLL 101 can prevent output clock signal PLL_OUT from toggling (can cause output clock signal PLL_OUT to stop toggling) because input node 131a of logic gate 131 (which is coupled to input node IN of synchronizer 132) has a signal level corresponding to logic zero. PLL 101 can prevent output clock signal PLL_OUT from toggling for a time interval during which control signal GATE_CTL has the same logic zero level.

As shown in FIG. 1, flip-flop 133 can include an input node (labeled "D") coupled to a voltage V1 (e.g., a supply voltage Vcc). The value of voltage V1 can correspond to logic one. Thus, input node D of flip-flop 133 can be fixed (unchanged) at a voltage corresponding to logic one. Flip-flop 133 can include an input node (e.g., a clock input node) coupled to node 110b to receive feedback clock signal $CLK_{FB}$. Flip-flop 133 can include an input node (labeled "CLR" (clear)) to receive a signal RS_1 from the output node of inverter 136. Inverter 136 includes an input node to receive a signal ALIGN_EN. Thus, signal RS_1 is an inverted version (e.g., a complementary) of signal ALIGN_EN. Flip-flop 133 can include an output node (labeled "Q") and an output node (labeled "Q*" (not "Q")). Output nodes Q and Q* can provide signals with complementary values (e.g., signal levels of opposite values (e.g., logic zero and logic one)). Output node Q can provide a signal RS_2. Output node Q can provide a signal SAMPL_FB. Flip-flop 133 can operate to cause signal SAMPL_FB to change from one signal level (e.g., a reset level corresponding to logic zero) to another signal level (e.g., a level corresponding to logic one) when an edge of feedback clock signal $CLK_{FB}$ is sampled (e.g., received at clock input node of flip-flop 133).

Flip-flop 134 can include an input node (labeled "D") coupled to a voltage V1. Thus, like input node D of flip-flop 133, input node D of flip-flop 134 can be fixed (unchanged) at a voltage corresponding to logic one. Flip-flop 134 can include an input node (e.g., a clock input node) coupled to node 110a to receive input clock signal $CLK_{REF}$. Flip-flop 134 can include an input node (labeled "CLR" (clear)) to receive signal RS_2 from output node Q* of flip-flop 133. Flip-flop 134 can include an output node (labeled "Q") and an output node (labeled "Q*"). Output nodes Q and Q* can provide signals with complementary values. Output node Q can provide a signal SAMPL_REF. Flip-flop 134 can operate to cause signal SAMPL_REF to change from one signal level (e.g., a reset level corresponding to logic zero) to another signal level (e.g., a level corresponding to logic one) when an edge of input clock signal $CLK_{REF}$ is sampled (e.g., received at clock input node of flip-flop 134).

Logic gate 135 can include input nodes to receive signals SAMPL_REF and SAMPL_FB, and an output node (coupled to node 137) to provide control signal GATE_CTL based on the values (e.g., signal levels) of signals SAMPL_REF and SAMPL_FB. PLL 101 can use control signal GATE_CTL to control synchronizer 132 in order to control the toggling of output clock signal PLL_OUT. For example, based on the value (e.g., signal level) of control signal GATE_CTL, PLL 101 can prevent output clock signal PLL_OUT from toggling during a portion of a time interval when the PLL performs an operation of aligning phases of input clock signal $CLK_{REF}$ and feedback clock signal $CLK_{FB}$.

Signal ALIGN_EN can be generated and controlled by circuitry (not shown) of PLL 101 that controls timing at which PLL 101 enters or exits certain mode of operations of PLL 101. Signal ALIGN_EN can be changed between different signal levels depending on which mode of operation that PLL 101 operates. For example, signal ALIGN_EN can be changed between different levels in response to PLL 101 entering or exiting a closed-loop operation mode. PLL 101 may enter a closed-loop operation mode from another mode (e.g., an inactive mode, such as power-saving mode, idle mode, sleep mode, or other modes).

PLL 101 can include a locked state. PLL 101 can be in the locked state (e.g., PLL is locked) when the phase (e.g., a rising edge) of feedback clock signal $CLK_{FB}$ is aligned with the phase (e.g., a rising edge) of input clock signal $CLK_{REF}$. When the feedback clock signal $CLK_{FB}$ is aligned (or deemed to be aligned), the phases (e.g., rising edges) of feedback clock signal $CLK_{FB}$ and input clock signal $CLK_{REF}$ can be within a specific value (e.g., within predetermined acceptable phase offset value).

Figure 2:
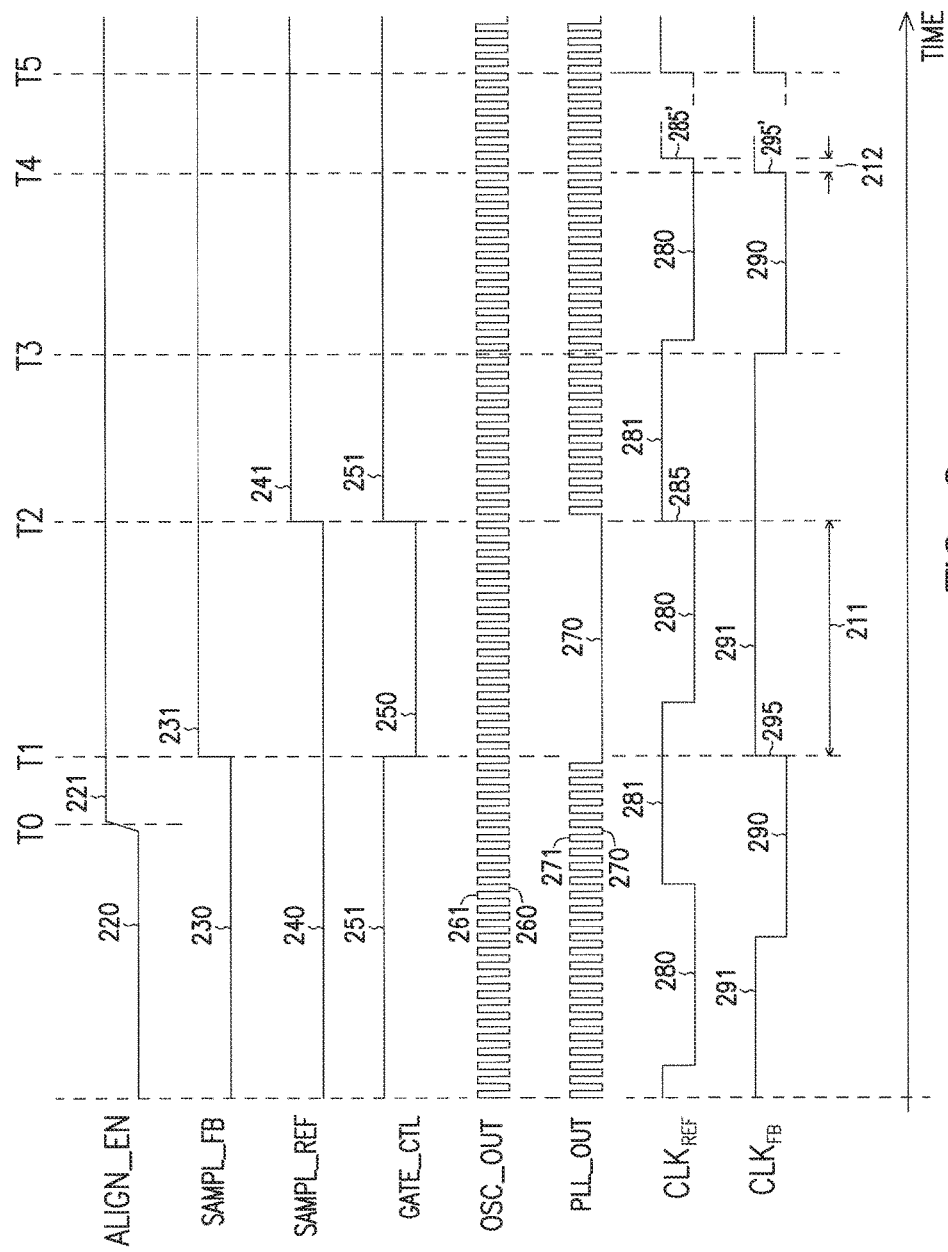
FIG. 2 shows an example timing diagram illustrating timing relationships among some of the signals of the PLL of FIG. 1, according to some embodiments described herein.

FIG. 2 shows an example timing diagram illustrating timing relationships among some of the signals of PLL 101 of FIG. 1, according to some embodiments described herein. The following description of the operation of PLL 101 refers to FIG. 1 and FIG. 2. In FIG. 2, T0 through T5 represent different times (points in time), where time T0 occurs before time T5.

Before time T0, PLL 101 may exit an inactive mode and enter a closed-loop operation mode. PLL 101 may be in an unlocked state after PLL 101 enters a closed-loop operation mode at some time before time T0. In the closed-loop operation mode, PLL 101 can perform a phase alignment operation (e.g., between times T0 and T5) to align the phases of input clock signal $CLK_{REF}$ and feedback clock signal $CLK_{FB}$. Then, PLL 101 enters the locked state after the phases of clock signal $CLK_{REF}$ and feedback clock signal $CLK_{FB}$ are aligned. After PLL 101 enters the locked state in the closed-loop operation mode, PLL 101 can operate to keep the phases of clock signal $CLK_{REF}$ and feedback clock signal $CLK_{FB}$ aligned in the closed-loop operation mode of PLL 101.

In FIG. 2, at time T0, PLL 101 may enter a phase alignment operation. Between times T0 and T5, PLL 101 performs a phase alignment operation to align the phases of input clock signal $CLK_{REF}$ and feedback clock signal $CLK_{FB}$. The phase alignment operation can include an initial stage (e.g., between times T0 and T4) and a subsequent (e.g., final) stage (e.g., between times T4 and T5).

Between times T0 and T4 (e.g., initial stage of the phase alignment operation), PLL 101 can operate to quickly (e.g., within one period of input clock signal $CLK_{REF}$) reduce a phase error (e.g., an initial phase error) 211 between the phases of input clock signal $CLK_{REF}$ and feedback clock signal $CLK_{FB}$. Quickly reducing phase error 211 allows a phase error (e.g., final phase error) 212 between the phases of input clock signal $CLK_{REF}$ and feedback clock signal $CLK_{FB}$ to be as small as possible at the end (e.g., at time T4) of the initial stage of the phase alignment operation. As an example, phase error 211 can be equal to multiple periods of signal OSC_OUT. Phase error 211 can be approximately equal to one period of signal OSC_OUT.

Between times T4 and T5, PLL 101 can continue to perform the phase alignment operation (e.g., a final stage of the phase alignment operation). PLL 101 can enter a locked state at time T5 (or after time T5), at which the phases of input clock signal $CLK_{REF}$ and feedback clock signal $CLK_{FB}$ are aligned. This means that at time T5, the phases (e.g., rising edges) of feedback clock signal $CLK_{FB}$ and input clock signal $CLK_{REF}$ can be within a specific value (e.g., within predetermined acceptable phase offset).

Quickly reducing phase error 211 also allows PLL 101 to enter a locked state in a relatively small amount time from time T4 because phase error 212 at time T4 may be at the minimum phase error between input clock signal $CLK_{REF}$ and feedback clock signal $CLK_{FB}$. Thus, PLL 101 can have a relatively reduced time (smaller amount of time) between the time PLL 101 enters a closed-loop operation mode and the time PLL 101 enters the locked state (the time PLL is locked). The reduction in the amount of time (e.g., the amount of time between times T0 and T4) can improve (e.g., reduce) power consumption of PLL 101 and overall power consumption of the device (e.g., an IC chip) that has PLL 101.

As shown in FIG. 2, before time T0 (and after PLL 101 enters a closed-loop operation mode), signal OSC_OUT can toggle between signal levels 260 and 261 (changes between signal levels 260 and 261) at a frequency (e.g., a predetermined frequency). Output clock signal PLL_OUT can toggle between signal levels 270 and 271 (changes between signal levels 270 and 271) at a frequency equal to the frequency of signal OSC_OUT. Both flip-flop 133 and 134 can be cleared (e.g., reset) such that signal SAMPL_FB can have a signal level 230 (e.g., a level corresponding to logic zero), and signal SAMPL_REF can have a signal level 240 (e.g., a level corresponding to logic zero).

At time T0, signal ALIGN_EN changes from a signal level 220 (e.g., a level corresponding to logic zero) to signal level 221 (e.g., level corresponding to logic one). The change to signal level 221 of signal ALIGN_EN causes signal RS_1 (FIG. 1) to change to a signal level corresponding to logic zero. In response to the change to a logic zero level of signal RS_1, flip-flop 133 is released from a clear state and is ready to sample a next rising edge (e.g., edge 295) of feedback clock signal $CLK_{FB}$.

At time T1, edge 295 of feedback clock signal $CLK_{FB}$ occurs. In response to the occurrence of edge 295, flip-flop 133 causes the signal level of signal SAMPL_FB to change from a signal level 230 (e.g., a level corresponding to logic zero) to signal level 231 (e.g., a level corresponding to logic one). The change to signal level 231 of signal SAMPL_FB causes the following activities.

Signal GATE_CTL (provided to input node IN of synchronizer 132) changes from a signal level 251 corresponding to logic one to a signal level 250 corresponding to logic zero (because signals SAMPL_FB and SAMPL_REF have different values (e.g., different signal levels)). The change to signal level 250 (logic zero) of control signal GATE_CTL causes the signal at the output node OUT of synchronizer 132 to also have a logic zero level. This causes signals OSC_OUT to be blocked (e.g., gated) from passing to node 140. Since output clock signal PLL_OUT is generated based on signal OSC_OUT, blocking (e.g., gating) signal OSC_OUT from passing to node 140 prevents output clock signal PLL_OUT from toggling (output clock signal PLL_OUT stops toggling at time T1). As described below, output clock signal PLL_OUT can start toggling again when signal OSC_OUT is unblocked (e.g., ungated) from passing to node 140. Thus, as shown in FIG. 2, output clock signal PLL_OUT can remain unchanged at signal level 270 for a time interval between times T1 and T2 and can toggle again at time T2. Since output clock signal PLL_OUT remains unchanged at signal level 270 for a time interval between times T1 and T2, and since feedback clock signal $CLK_{FB}$ is generated from output clock signal PLL_OUT, feedback clock signal $CLK_{FB}$ also stops changing signal levels between times T1 and T2. For example, as shown in FIG. 2, feedback clock signal $CLK_{FB}$ remains at the same signal level 291 for an extended duration between times T1 and T3.

The change to logic one level of signal SAMPL_FB at time T1 also causes the signal RS_2 at output node Q* of flip-flop 133 to change to a signal level corresponding to logic zero. In response to the change to logic zero level of signal RS_2, flip-flop 134 is released from a clear state and is ready to sample a next rising edge (e.g., edge 285) of input clock signal $CLK_{REF}$. As shown in FIG. 2, edge 285 can be the first rising edge of input clock signal $CLK_{REF}$ that occurs after time T1. Edge 285 can also be the first rising edge of input clock signal $CLK_{REF}$ that occurs after edge 295 of feedback clock signal $CLK_{FB}$ occurs.

At time T2, edge 285 of feedback clock signal $CLK_{FB}$ occurs. In response to the occurrence of edge 295, flip-flop 134 causes the signal level of signal SAMPL_REF to change from a signal level 240 (e.g., a level corresponding to logic zero) to signal level 241 (e.g., a level corresponding to logic one). The change in the signal level of signal SAMPL_REF causes the following activities.

At time T2, signal GATE_CTL changes from signal level 250 (corresponding to logic zero) to back to signal level 251 (corresponding to logic one one) because signals SAMPL_FB and SAMPL_REF at time T2 have the same value (same signal level). The change to logic one level of control signal GATE_CTL causes the signal at the output node OUT of synchronizer 132 to also have a logic one level (change from logic zero level to logic one level). This causes signals OSC_OUT to be unblocked (e.g., ungated) from passing to node 140. The unblocking (e.g., ungating) allows signal OSC_OUT to pass to node 140. This allows output clock signal PLL_OUT at node 140 to toggle again (e.g., changing between signal levels 270 and 271) at a frequency equal to the frequency of signal OSC_OUT.

As shown in FIG. 2, between time T2 and T4, signal ALIGN_EN can remain at the same signal level 221. As long as signal ALIGN_EN remains at signal level 221, the other signals, including signals SAMPL_REF, SAMPL_FB, GATE_CTL can also remain at their respective signal levels as shown in FIG. 2.

Between time T2 and T4, feedback clock signal $CLK_{FB}$ can resume (e.g., at time T3) changing between signal levels 290 and 291 at the frequency equal to the frequency of input clock signal $CLK_{REF}$. Signal OSC_OUT and output clock signal PLL_OUT can toggle between their respective signal levels at the same frequency.

At time T4, input clock signal $CLK_{REF}$ and feedback clock signal $CLK_B$ can have phase error 212 (at edges 295' and 285'). Phase error 212 may be caused by the nature of the operation of synchronizer 132. For example, since output clock signal PLL_OUT is sampled through synchronizer 132 (using signal OSC_OUT), a phase error of one clock period of signal OSC_OUT may occur between input clock signal $CLK_{REF}$ and feedback clock signal $CLK_{FB}$. Thus, in FIG. 2, phase error 212 can be approximately one clock period of signal OSC_OUT.

Between times T4 and T5, PLL 101 can continue the phase alignment operation (e.g., perform the subsequent (e.g., final) stage of the phase alignment operation). PLL 101 may continue to perform the phase alignment operation until the time (e.g., time T5) at which the phases of input clock signal $CLK_{REF}$ and feedback clock signal $CLK_{FB}$ are aligned. PLL 101 can enter a locked state (e.g., time T5 or after time T5) after the phases of input clock signal $CLK_{REF}$ and feedback clock signal $CLK_{FB}$ are aligned.

The operation of PLL 101 between times T4 and T5 can include the following activities (e.g., a phase alignment operation of a PLL, such as PLL 101). For example, at time T4, detector 112 (FIG. 1) can compare the phases of input clock signal $CLK_{REF}$ and feedback clock signal $CLK_{FB}$. Based on the comparison, PLL 101 can generate control information, which can include information to adjust the timing (e.g., phase) of signal OSC_OUT. Filter 114 can perform a filtering operation on the control information and provide the filtered control information to oscillator 116. Based on the filtered control information, oscillator 116 can adjust (e.g., speed up or slow down) the phase of signal OSC_OUT. PLL 101 can provide the adjusted signal OSC_OUT to detector 112 in the form of feedback clock signal $CLK_{FB}$ through frequency divider 121. Then (between times T4 and T5), PLL 101 repeats the operations of detector 112, filter 114, oscillator 116, and frequency divider 121 until the phases of input clock signal $CLK_{REF}$ and feedback clock signal $CLK_{FB}$ are aligned (e.g., aligned at time T5). PLL 101 can enter a locked state (e.g., at time T5 or after time T5) after the phases of input clock signal $CLK_{REF}$ and feedback clock signal $CLK_{FB}$ are aligned.

PLL 101 includes improvements over some conventional PLLs. For example, as mentioned above, some conventional PLLs may have a lengthy phase alignment operation that can become a bottleneck for the overall locking operation of such conventional PLLs. In PLL 101, since an initial phase error (e.g., phase error 212) can be quickly reduced, the phase alignment operation of PLL 101 can be relatively faster than that of some conventional PLLs. The quick phase alignment operation allows PLL 101 to achieve a faster lock (e.g., enters a locked state faster) than the conventional PLLs. The quick phase alignment operation also improves the operations (e.g., increases the speed of the operations) of the device (e.g., IC chip) that has PLL 101. Moreover, since PLL 101 can have a relatively quick phase alignment operation, PLL 101 may use less power to enter a locked state than some conventional PLLs. This can also reduce overall power consumption the device (e.g., an IC chip) that has PLL 101.

As described above with reference to FIG. 1 and FIG. 2, PLL 101 can operate to prevent output clock signal PLL_OUT from toggling during a portion (e.g., an amount of time between times T1 and T2) of the time interval between times T0 and T5. PLL 101 can sample the rising edges (e.g., edges 295 and 285) of feedback clock signal $CLK_{FB}$ and input clock signal $CLK_{REF}$ in order to determine the amount of time (e.g., an amount of time between times T1 and T2) to prevent output clock signal PLL_OUT from toggling. Preventing output clock signal PLL_OUT from toggling effectively prevents circuit 130 (e.g., frequency divider 121) from performing its normal operation (e.g., prevents feedback clock signal $CLK_{FB}$ from changing between signal levels) for the same amount of time (e.g., the amount of time between times T1 and T2). This means that PLL 101 prevents feedback clock signal $CLK_{FB}$ from changing from signal level 291 to signal level 290 during the same time interval (e.g., between times T1 and T2) that output clock signal PLL_OUT is prevented from toggling. After output clock signal PLL_OUT is allowed to toggle again, subsequent rising edges (e.g., 295' and 285') of input clock signal $CLK_{REF}$ and feedback clock signal $CLK_{FB}$ can have a relatively small error (e.g., phase error 212). This means that an initial phase error (e.g., phase error 211 in FIG. 2) of PLL 101 can be quickly reduced (e.g., reduced in a relatively small amount of time). This allows PLL 101 to reduce the overall time for the phase alignment operation, resulting in improvements in PLL 101 over conventional PLLs, as discussed above.

Figure 3:
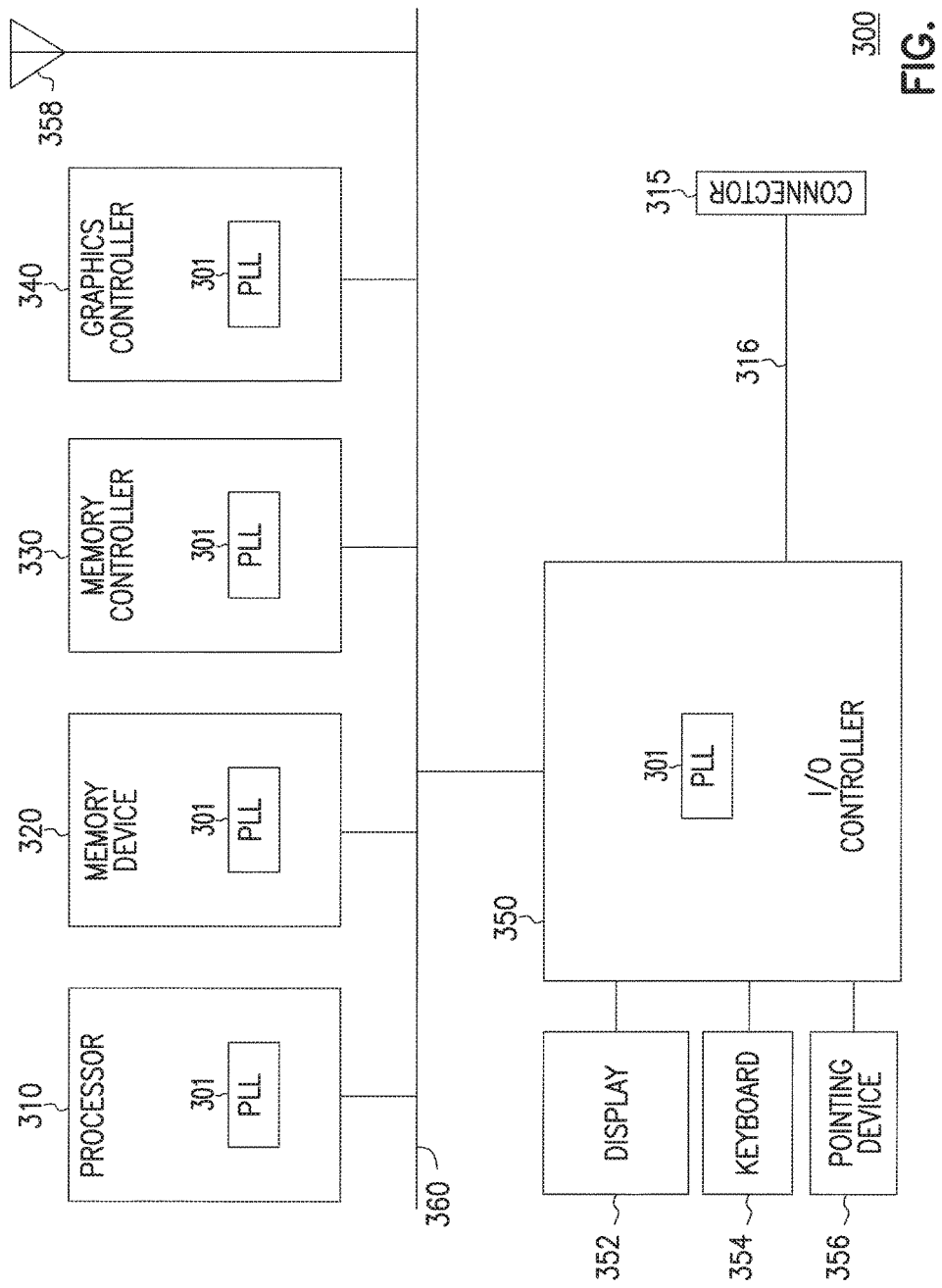
FIG. 3 shows an apparatus in the form of a system (e.g., electronic system), according to some embodiments described herein.

FIG. 3 shows an apparatus in the form of a system (e.g., electronic system) 300, according to some embodiments described herein. System 300 can include or be included in a computer, a tablet, or other electronic systems. As shown in FIG. 3, system 300 can include a processor 310, a memory device 320, a memory controller 330, a graphics controller 340, an input/output (I/O) controller 350, a display 352, a keyboard 354, a pointing device 356, at least one antenna 358, a connector 315, and a bus 360 (e.g., conductive lines formed on a circuit board (not shown) of system 300).

Each of processor 310, memory device 320, memory controller 330, graphics controller 340, and I/O controller 350 can include an IC chip.

In some arrangements, system 300 does not have to include a display. Thus, display 352 can be omitted from system 300. In some arrangements, system 300 does not have to include any antenna. Thus, antenna 358 can be omitted from system 300.

Processor 310 can include a general-purpose processor or an application specific integrated circuit (ASIC). Processor 310 can include a central processing unit (CPU).

Memory device 320 can include a dynamic random access memory (DRAM) device, a static random access memory (SRAM) device, a flash memory device, phase change memory, a combination of these memory devices, or other types of memory. FIG. 3 shows an example where memory device 320 is a stand-alone memory device separated from processor 310. In an alternative arrangement, memory device 320 and processor 310 can be located on the same die. In such an alternative arrangement, memory device 320 is an embedded memory in processor 310, such as embedded DRAM (eDRAM), embedded SRAM (eSRAM), embedded flash memory, or another type of embedded memory.

Display 352 can include a liquid crystal display (LCD), a touchscreen (e.g., capacitive or resistive touchscreen), or another type of display. Pointing device 356 can include a mouse, a stylus, or another type of pointing device.

I/O controller 350 can include a communication module for wired or wireless communication (e.g., communication through one or more antennas 358). Such wireless communication may include communication in accordance with WiFi communication technique, Long Term Evolution Advanced (LTE-A) communication technique, or other communication techniques.

I/O controller 350 can also include a module to allow system 300 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt. Peripheral Component Interconnect Express (PCIe), Ethernet, and other specifications.

Connector 315 can be arranged (e.g., can include terminals, such as pins) to allow system 300 to be coupled to an external device (or system). This may allow system 300 to communicate (e.g., exchange information) with such a device (or system) through connector 315. Connector 315 may be coupled to I/O controller 350 through a connection 316 (e.g., a bus).

Connector 315, connection 316, and at least a portion of bus 360 can include elements (e.g., conductive terminals, conductive lines, or other conductive elements) that conform with at least one of USB, DP, HDMI, Thunderbolt, PCIe, Ethernet, and other specifications.

FIG. 3 shows the elements (e.g., devices and controllers) of system 300 arranged separately from each other as an example. For example, each of processor 310, memory device 320, memory controller 330, graphics controller 340, and I/O controller 350 can be located on a separate IC chip (e.g., separate semiconductor dies). In some arrangements, two or more elements (e.g., processor 310, memory device 320, graphics controller 340, and I/O controller 350) of system 300 can be located on the same die (e.g., same IC chip) that can form a system-on-chip (SoC).

As shown in FIG. 3, each of processor 310, memory device 320, memory controller 330, graphics controller 340, and I/O controller 350 can include a PLL 301. PLL 301 can include PLL 101 described above with reference to FIG. 1 and FIG. 2.

Figure 4:
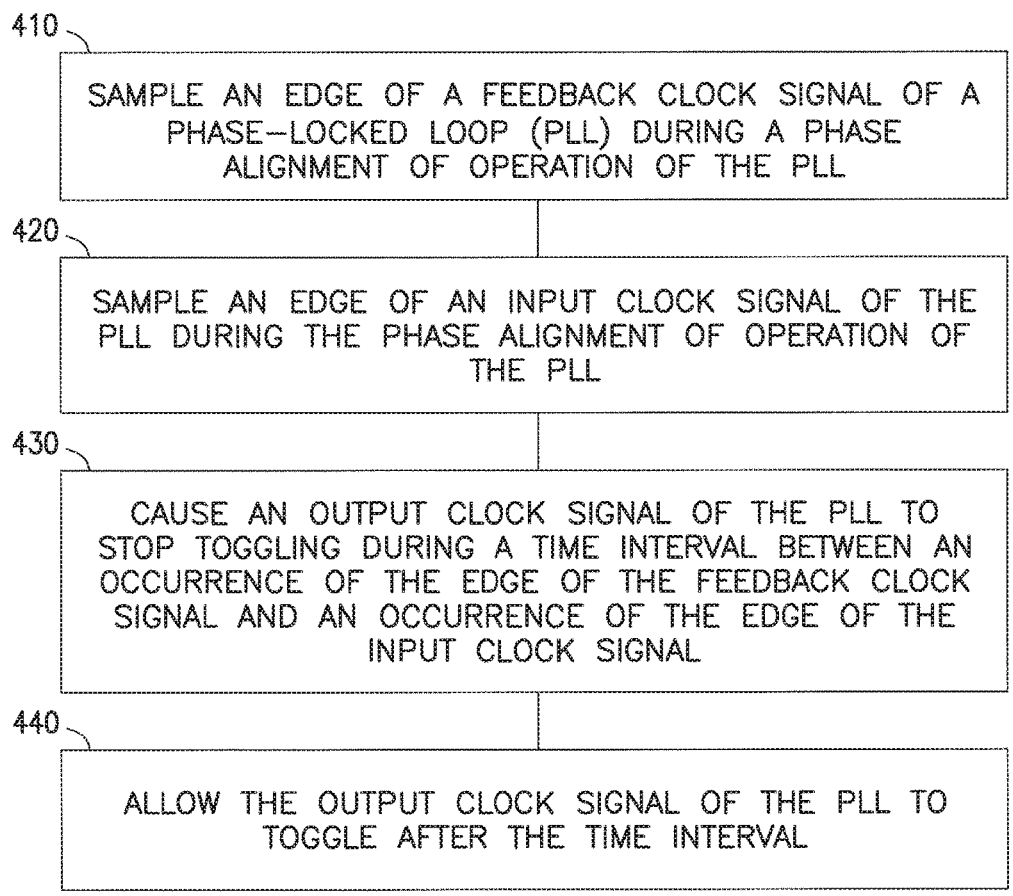
FIG. 4 is a flowchart showing a method of operating an apparatus, according to some embodiments described herein.

FIG. 4 is a flowchart showing a method 400 of operating an apparatus, according to some embodiments described herein. The apparatus used in method 400 can include any of the apparatuses (e.g., apparatus 100 and system 300 including PLLs 101 and 301) described above with reference to FIG. 1 through FIG. 3. Some of the activities in method 400 may be performed by hardware, software, firmware, or any combination of hardware, software, and firmware. For example, some of the activities in method 400 may be performed by hardware, software, firmware, or any combination of hardware, software, and firmware implemented in any of the apparatus (e.g., apparatus 100 and system 300 including PLLs 101 and 301) described above with reference to FIG. 1 through FIG. 3.

As shown in FIG. 4, activity 410 of method 400 can include sampling an edge of a feedback clock signal of a PLL during a phase alignment of operation of the PLL. Activity 420 can include sampling an edge of an input clock signal of the PLL during the phase alignment of operation of the PLL. Activity 430 can include causing an output clock signal of the PLL to stop toggling during a time interval between an occurrence of the edge of the feedback clock signal and an occurrence of the edge of the input clock signal. Activity 440 can include allowing the output clock signal of the PLL to toggle after the time interval.

Method 400 can include fewer or more activities relative to activities 410, 420, 430, and 440 shown in FIG. 4. For example, method 400 can include activities and operations of apparatus 100 and system 300 including PLLs 101 and 301 described above with reference to FIG. 1 through FIG. 3.

The illustrations of the apparatuses (e.g., apparatus 100 and system 300 including PLLs 101 and 301) and methods (e.g., method 400 and operations of apparatus 100 and system 300 including operations of PLLs 101 and 301) described above are intended to provide a general understanding of the structure of different embodiments and are not intended to provide a complete description of all the elements and features of an apparatus that might make use of the structures described herein.

The apparatuses and methods described above can include or be included in high-speed computers, communication and clock signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 4) players), vehicles, medical devices (e.g., heart monitors, blood pressure monitors, etc.), set top boxes, and others.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

ADDITIONAL NOTES AND EXAMPLES

Example 1 includes subject matter (such as a device, an electronic apparatus (e.g., circuit, electronic system, or both), or a machine) including a first circuit included in a phase-locked loop (PLL) to receive an input clock signal and a feedback clock signal, and to generate an output clock signal, a second circuit included in the PLL to generate the feedback clock signal from the output clock signal, and a third circuit to prevent the output clock signal from toggling during a portion of a time interval when the PLL performs an operation of aligning phases of the input clock signal and feedback clock signal.

In Example 2, the subject matter of Example 1 may optionally include, wherein the third circuit is to sample an edge of the feedback clock signal and an edge of the input clock signal during the time interval, and prevent the feedback clock signal from changing from a first signal level to a second signal level during a time interval between an occurrence of the edge of the feedback clock signal and an occurrence of the edge of the input clock signal.

In Example 3, the subject matter of Example 1 may optionally include, wherein the third circuit is to allow the output clock signal to toggle after the portion of the time interval.

In Example 4, the subject matter of any of Examples 1-3 may optionally include, wherein the time interval occurs before the PLL enters a locked state.

In Example 5, the subject matter of any of Examples 1-3 may optionally include, wherein the time interval occurs after the PLL enters a closed-loop operation mode.

Example 6 includes subject matter (such as a device, an electronic apparatus (e.g., circuit, electronic system, or both), or a machine) including a first circuit included in a phase-locked loop (PLL) to receive an input clock signal and a feedback clock signal, and to generate an output clock signal, a second circuit included in the PLL to generate the feedback clock signal from the output clock signal, a third circuit to sample an edge of the feedback clock signal and an edge of the input clock signal when the PLL performs an operation of aligning phases of the input clock signal and feedback clock signal, and the third circuit to prevent the feedback clock signal from changing from a first signal level to a second signal level during a time interval between an occurrence of the edge of the feedback clock signal and an occurrence of the edge of the input clock signal.

In Example 7, the subject matter of Example 6 may optionally include, wherein the third circuit is to prevent the output clock signal from toggling during the time interval between the occurrence of the edge of the feedback clock signal and the occurrence of the edge of the input clock signal.

In Example 8, the subject matter of Example 6 may optionally include, wherein the third circuit is to allow the feedback clock signal to change between the first and second signal levels after the time interval.

In Example 9, the subject matter of any of Examples 6-8 may optionally include, wherein the time interval occurs after the PLL enters a closed-loop operation mode.

In Example 10, the subject matter of any of Examples 6-8 may optionally include, wherein the time interval occurs before the PLL enters a locked state.

In Example 11, the subject matter of any of Examples 6-8 may optionally include, wherein the edge of each of the input clock signal and the feedback clock signal includes a rising edge.

Example 12 includes subject matter (such as a device, an electronic apparatus (e.g., circuit, electronic system, or both), or a machine) including a first circuit included in a phase-locked loop (PLL), the circuit including a first input node to receive an input clock signal, a second input node to receive a feedback clock signal, and an oscillator including an oscillator output node to provide an oscillating clock signal having a first frequency, logic circuitry including a first input node coupled to the oscillator output node, a second input node to receive a control signal, and an output node to provide an output clock signal having a second frequency equal to the first frequency, a frequency divider including an output node to provide the feedback clock signal based on the output clock signal, and a second circuit to provide the control signal to the logic circuitry based on the input clock signal and the feedback clock signal.

In Example 13, the subject matter of Example 12 may optionally include, wherein the second circuit includes a first flip-flop including an input node coupled to the first input node of the first circuit, a second flip-flop including an input node coupled to the second input node of the first circuit, and a logic gate having a first input node coupled to an output node of the first flip-flop, a second input node coupled to an output node of second flip-flop, and an output node to provide the control signal.

In Example 14, the subject matter of Example 13 may optionally include, wherein the logic circuitry includes a logic gate, the logic gate including an input node coupled to the oscillator output node and an output node to provide the output clock signal.

In Example 15, the subject matter of Example 14 may optionally include, wherein the logic circuitry includes a synchronizer coupled to the oscillator and the logic gate.

In Example 16, the subject matter of any of Examples 12-15 may optionally include, further comprising a selector, the selector including an input node coupled to an output node of the frequency divider, and an output node coupled to the second input node of the first circuit.

In Example 17, the subject matter of any of Examples 12-15 may optionally include, wherein the oscillator includes one of a voltage-controlled oscillator and a digitally-controlled oscillator.

In Example 18, the subject matter of any of Examples 12-15 may optionally include, wherein the first circuit includes a phase detector including input nodes coupled to the first and second input nodes of the first circuit, and a filter coupled between the phase detector and the oscillator.

Example 19 includes subject matter (such as a device, an electronic apparatus (e.g., circuit, electronic system, or both), or a machine) including conductive lines on a circuit board, an antenna coupled to the conductive lines, and a device coupled to the conductive lines, the device including a phase-locked loop (PLL), the PLL including a first circuit to receive an input clock signal and a feedback clock signal, and to generate an output clock signal, a second circuit to generate the feedback clock signal from the output clock signal, and a third circuit to prevent the output clock signal from toggling during a portion of a time interval when the PLL performs an operation of aligning phases of the input clock signal and feedback clock signal.

In Example 20, the subject matter of Examples 19 may optionally include, wherein the device includes a processor.

In Example 21, the subject matter of Example 19 or 20 may optionally include, further comprising a connector coupled to at least one of the conductive lines and the device, the connector conforming with at least one of Universal Serial Bus (USB), DisplayPort (DP), High-Definition Multimedia Interface (HDMI), Thunderbolt, Ethernet, and Peripheral Component Interconnect Express (PCIe) specifications.

Example 22 includes subject matter such as a device, an electronic apparatus (e.g., circuit, electronic system, or both), or a machine) including sampling an edge of a feedback clock signal of a phase-locked loop (PLL) during a phase alignment of operation of the PLL, sampling an edge of an input clock signal of the PLL during the phase alignment of operation of the PLL, causing an output clock signal of the PLL to stop toggling during a time interval between an occurrence of the edge of the feedback clock signal and an occurrence of the edge of the input clock signal, and allowing the output clock signal of the PLL to toggle after the time interval.

In Example 23, the subject matter of Example 22 may optionally include, further comprising continuing to perform phase alignment of operation of the PLL after the time interval until the PLL is locked.

In Example 24, the subject matter of Example 22 may optionally include, further comprising preventing the feedback clock signal from changing from a first signal level to a second signal level during the time interval.

In Example 25, the subject matter of any of Examples 22-24 may optionally include, wherein causing the output clock signal of the PLL to stop toggling includes blocking an oscillating signal generated by an oscillator of the PLL from passing from the oscillator to an output node of the PLL, and the output clock signal of the PLL is provided at the output node of the PLL.

In Example 26, the subject matter of any of Examples 22-24 may optionally include, wherein causing the output clock signal of the PLL to stop toggling includes blocking an oscillating signal generated by an oscillator of the PLL from passing from the oscillator to an output node of the PLL, wherein the feedback clock signal is generated by a frequency divider of the PLL, the frequency divider including an input node coupled to the output node of the PLL, and an output node to provide the feedback clock signal.

Example 27 includes subject matter (such as a device, an electronic apparatus (e.g., circuit, electronic system, or both), or machine) including means for performing any of the subject matter of Examples 22-26.

The subject matter of Example 1 through Example 27 may be combined in any combination.

In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" can mean A only (excluding B), or B only (excluding A). In another example, if items A, B, and C are listed, then the phrase "one of A, B and C" can mean A only; B only; or C only. Item A can include a single element or multiple elements. Item B can include a single element or multiple elements. Item C can include a single element or a multiple elements.

The Abstract is provided to comply with 47 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first circuit included in a phase-locked loop (PLL) to generate an oscillating clock signal based on an input clock signal and a feedback signal, the feedback signal generated based on one of a first feedback clock signal and a second feedback signal;
   a second circuit included in the PLL to generate the first feedback clock signal from an output clock signal; and
   a third circuit to generate the output clock signal based on the oscillating clock signal and to prevent the output clock signal from toggling during a portion of a time interval when the PLL performs an operation of aligning phases of the input clock signal and the first feedback clock signal.

2. The apparatus of claim 1, wherein the third circuit is to:
   sample an edge of the feedback clock signal and an edge of the input clock signal during the time interval; and
   prevent the first feedback clock signal from changing from a first signal level to a second signal level during a time interval between an occurrence of the edge of the first feedback clock signal and an occurrence of the edge of the input clock signal.

3. The apparatus of claim 1, wherein the third circuit is to allow the output clock signal to toggle after the portion of the time interval.

4. The apparatus of claim 1, wherein the time interval occurs before a phase of the first feedback clock signal is aligned with a phase of input clock signal.

5. The apparatus of claim 1, wherein the time interval occurs after the PLL exit one a mode, the mode including one of an inactive mode, an idle mode, and a sleep mode.

6. An apparatus comprising:
   a first circuit included in a phase-locked loop (PLL) to generate an oscillating clock signal based on an input clock signal and a feedback signal, the feedback signal generated based on one of a first feedback clock signal and a second feedback signal;
   a second circuit included in the PLL to generate the first feedback clock signal from an output clock signal;
   a third circuit to sample an edge of the feedback clock signal and an edge of the input clock signal when the PLL performs an operation of aligning phases of the input clock signal and the first feedback clock signal; and
   the third circuit to generate the output clock signal based on the oscillating clock signal and to prevent the first feedback clock signal from changing from a first signal level to a second signal level during a time interval between an occurrence of the edge of the first feedback clock signal and an occurrence of the edge of the input clock signal.

7. The apparatus of claim 6, wherein the third circuit is to prevent the output clock signal from toggling during the time interval between the occurrence of the edge of the first feedback clock signal and the occurrence of the edge of the input clock signal.

8. The apparatus of claim 6, wherein the third circuit is to allow the first feedback clock signal to change between the first and second signal levels after the time interval.

9. The apparatus of claim 6, wherein the time interval occurs after the PLL exit one a mode, the mode inducing one of an inactive mode, an idle mode, and a sleep mode.

10. The apparatus of claim 6, wherein the time interval occurs before the PLL enters a locked state.

11. The apparatus of claim 6, wherein the edge of each of the input clock signal and the first feedback clock signal includes a rising edge.

12. An apparatus comprising:
a first circuit included in a phase-locked loop (PLL), the first circuit including a first input node to receive an input clock signal, a second input node to receive a feedback clock signal, and an oscillator including an oscillator output node to provide an oscillating clock signal having a first frequency;
logic circuitry including a first input node coupled to the oscillator output node, a second input node to receive a control signal, and an output node to provide an output clock signal having a second frequency equal to the first frequency;
a frequency divider including an output node to provide the feedback clock signal based on the output clock signal; and
a second circuit to provide the control signal to the logic circuitry based on the input clock signal and the feedback clock signal.

13. The apparatus of claim 12, wherein the second circuit includes:
a first flip-flop including an input node coupled to the first input node of the first circuit;
a second flip-flop including an input node coupled to the second input node of the first circuit; and
a logic gate having a first input node coupled to an output node of the first flip-flop, a second input node coupled to an output node of second flip-flop, and an output node to provide the control signal.

14. The apparatus of claim 13, wherein the logic circuitry includes a logic gate, the logic gate including an input node coupled to the oscillator output node and an output node to provide the output clock signal.

15. The apparatus of claim 14, wherein the logic circuitry includes a synchronizer coupled to the oscillator and the logic gate.

16. The apparatus of claim 12, further comprising a selector, the selector including an input node coupled to an output node of the frequency divider, and an output node coupled to the second input node of the first circuit.

17. The apparatus of claim 12, wherein the oscillator includes one of a voltage-controlled oscillator and a digitally-controlled oscillator.

18. The apparatus of claim 12, wherein the first circuit includes a phase detector including input nodes coupled to the first and second input nodes of the first circuit, and a filter coupled between the phase detector and the oscillator.

19. An apparatus comprising:
conductive lines on a circuit board;
an antenna coupled to the conductive lines; and
a device coupled to the conductive lines, the device including a phase-locked loop (PLL), the PLL including:
a first circuit to generate an oscillating clock signal based on an input clock signal and a feedback signal, the feedback signal generated based on one of a first feedback clock signal and a second feedback signal;
a second circuit to generate the first feedback clock signal from the output clock signal; and
a third circuit to generate the output clock signal based on the oscillating clock signal and to prevent the output clock signal from toggling during a portion of a time interval when the PLL performs an operation of aligning phases of the input clock signal and the first feedback clock signal.

20. The apparatus of claim 19, wherein the device includes a processor.

21. The apparatus of claim 19, further comprising a connector coupled to at least one of the conductive lines and the device, the connector conforming with at least one of Universal Serial Bus (USB), DisplayPort (DP), High-Definition Multimedia Interface (HDMI), Thunderbolt, Ethernet, and Peripheral Component Interconnect Express (PCIe) specifications.

* * * * *